(12) United States Patent
Zeng (10) Patent No.: US 12,213,370 B2
(45) Date of Patent: Jan. 28, 2025

(54) DISPLAY PANEL AND METHOD OF MANUFACTURING THE SAME

(71) Applicant: Shenzhen China Star Optoelectronics Semiconductor Display Technology Co., Ltd., Guangdong (CN)

(72) Inventor: Weijing Zeng, Guangdong (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 0 days.

(21) Appl. No.: 17/614,528

(22) PCT Filed: Nov. 5, 2021

(86) PCT No.: PCT/CN2021/128910
§ 371 (c)(1),
(2) Date: Nov. 28, 2021

(87) PCT Pub. No.: WO2023/070728
PCT Pub. Date: May 4, 2023

(65) Prior Publication Data
US 2024/0032384 A1    Jan. 25, 2024

(30) Foreign Application Priority Data
Oct. 28, 2021 (CN) .......................... 202111263109.0

(51) Int. Cl.
*H10K 59/80* (2023.01)
*H10K 59/12* (2023.01)
*H10K 59/122* (2023.01)

(52) U.S. Cl.
CPC ... *H10K 59/80516* (2023.02); *H10K 59/1201* (2023.02); *H10K 59/122* (2023.02)

(58) Field of Classification Search
CPC ....... H10K 50/00–88; H10K 59/00–95; H10K 65/00; H10K 71/00–861; H10K 85/00–791; H10K 2101/00–90; H10K 2102/00–361
See application file for complete search history.

(56) References Cited

U.S. PATENT DOCUMENTS

| | | | |
|---|---|---|---|
| 2015/0084008 A1* | 3/2015 | Park | H01L 27/124 438/34 |
| 2018/0151824 A1* | 5/2018 | Park | H10K 71/00 |
| 2018/0166649 A1* | 6/2018 | Woo | H10K 59/122 |
| 2021/0367020 A1* | 11/2021 | Bok | H10K 59/1213 |

* cited by examiner

*Primary Examiner* — Evren Seven
*Assistant Examiner* — Cole Leon Lindsey (57) ABSTRACT

A display panel and a method thereof for manufacturing the same are provided. The display panel includes a pixel electrode layer and an auxiliary electrode layer. A side surface of the pixel electrode layer away from an array substrate is lower than a side surface of the auxiliary electrode layer away from the array substrate, so that topography of a second opening is higher than that of a first opening of a light-emitting region of a pixel, and it is difficult for a light-emitting functional layer to be deposited into the second opening to decrease the resistance of a bridging portion between the second electrode layer and the auxiliary electrode layer.

17 Claims, 3 Drawing Sheets

DISPLAY PANEL AND METHOD OF MANUFACTURING THE SAME

RELATED APPLICATIONS

This application is a National Phase of PCT Patent Application No. PCT/CN2021/128910 having International filing date of Nov. 5, 2021, which claims the benefit of priority of Chinese Patent Application No. 202111263109.0 filed on Oct. 28, 2021. The contents of the above applications are all incorporated by reference as if fully set forth herein in their entirety.

FIELD AND BACKGROUND OF THE INVENTION

This disclosure relates to a technical field of a display, and more particularly to a display panel and a method thereof for manufacturing the same.

An organic light emitting diode (OLED) has the self-luminous, high brightness, wide viewing angle, high contrast, flexible, low energy consumptive properties and the like, and thus receives widespread attentions. The OLED display functioning as a new generation of display has started to gradually replace a conventional liquid crystal display (LCD), and widely applied to display panels having high resolutions and high refresh rates, such as a mobile phone screen, a computer display, a full-color television and the like. The brightness uniformity of the panel is more affected by a charging rate and a voltage drop (IR drop). Usually, the brightness distribution shows a trend of the bright peripheral portions and the dark middle portion.

At present, the industry has improved the IR drop problem of the large-size panel by generally adopting auxiliary cathode wiring, and bridging a surface cathode and an auxiliary cathode through an auxiliary cathode contact hole to implement the parallel connection between the surface cathode and the auxiliary cathode wiring to achieve the objective of decreasing the cathode resistance of the OLED.

SUMMARY OF THE INVENTION

In the process of research and practice of the existing technology, the inventor of this disclosure has found that the auxiliary cathode wiring and the cathode bridging need the configuration of the cathode contact hole. The shape and the film layer structure of the cathode contact hole affect the aperture ratio of the pixel, or even affect the process practicability. If low-cost printing and film forming processes are adopted in the OLED product, a linear pixel-definition-layer pixel (line-bank pixel) design is generally adopted to obtain the better uniformity of light-emitting film formation. For the line-bank pixel, the cathode contact hole is configured in a print region. In the present technology, an organic layer material is deposited in the contact hole, thereby increasing the contact resistance between the surface cathode and the auxiliary cathode.

An embodiment of this disclosure provides a display panel and a method of manufacturing the same capable of decreasing contact resistances of a surface cathode layer and an auxiliary electrode layer.

Technical Solutions

An embodiment of this disclosure provides a display panel, including:
an array substrate;
a first electrode layer, which is disposed on the array substrate and includes a pixel electrode layer and an auxiliary electrode layer;
a pixel definition layer disposed on one side of the first electrode layer away from the array substrate, wherein a first opening and a second opening are disposed on the pixel definition layer, the first opening is disposed in correspondence with the pixel electrode layer, the second opening is disposed in correspondence with the auxiliary electrode layer, and a side surface of the pixel electrode layer away from the array substrate is lower than a side surface of the auxiliary electrode layer away from the array substrate;
a light-emitting functional layer, which is disposed on one side of the pixel electrode layer away from the array substrate, and connected to the pixel electrode layer through the first opening; and
a second electrode layer, which is disposed on one side of the light-emitting functional layer away from the array substrate, and connected to the auxiliary electrode layer through the second opening.

Optionally, in some embodiments of this disclosure, the display panel further includes an elevation layer disposed on the array substrate, wherein the auxiliary electrode layer is disposed in correspondence with the elevation layer and disposed on one side of the elevation layer away from the array substrate.

Optionally, in some embodiments of this disclosure, the display panel further includes a planarization layer, wherein the planarization layer includes a first planarization layer and a second planarization layer, the first planarization layer is disposed on the array substrate, the second planarization layer is disposed on one side of the first planarization layer away from the array substrate, the second planarization layer partially covers the first planarization layer, the auxiliary electrode layer is disposed in correspondence with the second planarization layer, and the elevation layer is the second planarization layer.

Optionally, in some embodiments of this disclosure, the display panel further includes a planarization layer disposed on the array substrate, a protrusion is disposed on the planarization layer, and the elevation layer is the protrusion.

Optionally, in some embodiments of this disclosure, a thickness of the auxiliary electrode layer is the same as a thickness of the pixel electrode layer.

Optionally, in some embodiments of this disclosure, the elevation layer is a single-layer structure or a laminated structure including a combination of one or more of polyimide, polyethylene naphthalate, polyethylene terephthalate, polyarylate, polycarbonate, polyetherimide and polyethersulfone.

Optionally, in some embodiments of this disclosure, the elevation layer is a single-layer structure or a laminated structure having a material selected from a group consisting of a silicon oxygen compound, a silicon nitrogen compound and a silicon oxygen nitrogen compound.

Optionally, in some embodiments of this disclosure, a thickness of the auxiliary electrode layer is greater than a thickness of the pixel electrode layer.

Optionally, in some embodiments of this disclosure, at least a bottom surface of the second opening is lyophobic.

Optionally, in some embodiments of this disclosure, both the bottom surface of the second opening and a sidewall of the second opening are lyophobic.

Optionally, in some embodiments of this disclosure, the pixel definition layer on two sides of the pixel electrode layer has different heights.

Optionally, in some embodiments of this disclosure, one side of the pixel definition layer near the array substrate is lyophilic, and one side of the pixel definition layer away from the array substrate is lyophobic.

Optionally, in some embodiments of this disclosure, the array substrate includes a substrate, a light-shielding layer disposed on the substrate, a buffer layer being disposed on the substrate and covering the light-shielding layer, an active layer, a gate insulating layer and a gate layer sequentially laminated on the buffer layer from bottom to top, an interlayer dielectric layer being disposed above the buffer layer and covering the active layer, the gate insulating layer and the gate layer, and a source and a drain disposed on the interlayer dielectric layer.

Optionally, in some embodiments of this disclosure, the active layer includes a channel region, and a source region and a drain region disposed on two sides of the channel region, and the source and the drain are respectively electrically connected to the source region and the drain region.

Optionally, in some embodiments of this disclosure, the array substrate further includes a passivation layer covering the source and the drain, and the pixel electrode layer passes through the passivation layer and is connected to the source or the drain.

Correspondingly, this disclosure further provides a method of manufacturing a
display panel. The method includes steps of:
providing an array substrate;
disposing a first electrode layer on the array substrate, the first electrode layer including a pixel electrode layer and an auxiliary electrode layer;
disposing a pixel definition layer on one side of the first electrode layer away from the array substrate;
disposing a first opening on the pixel definition layer and in correspondence with the pixel electrode layer, and disposing a second opening in correspondence with the auxiliary electrode layer, wherein a side surface of the pixel electrode layer away from the array substrate is lower than a side surface of the auxiliary electrode layer away from the array substrate;
disposing a light-emitting functional layer on one side of the pixel electrode layer away from the array substrate, the light-emitting functional layer being connected to the pixel electrode layer through the first opening; and
disposing a second electrode layer on one side of the light-emitting functional layer away from the array substrate, the second electrode layer being connected to the auxiliary electrode layer through the second opening.

Optionally, in some embodiments of this disclosure, the step of disposing a first opening on the pixel definition layer and in correspondence with the pixel electrode layer, and disposing a second opening in correspondence with the auxiliary electrode layer, includes a step of: performing halftone mask processing on the pixel definition layer to dispose a first opening on the pixel definition layer and in correspondence with the pixel electrode layer, and to dispose a second opening in correspondence with the auxiliary electrode layer.

Optionally, in some embodiments of this disclosure, the method further includes, after the step of disposing the first opening on the pixel definition layer and in correspondence with the pixel electrode layer, and disposing the second opening in correspondence with the auxiliary electrode layer, a step of: evaporating a hydrophobic material in the second opening to make at least a bottom surface of the second opening become lyophobic.

Optionally, in some embodiments of this disclosure, the method further includes, after the step of disposing the first opening on the pixel definition layer and in correspondence with the pixel electrode layer, and disposing the second opening in correspondence with the auxiliary electrode layer, a step of: adding a hydrophobic material to the bottom surface of the second opening, wherein the hydrophobic material undergoes a self-assembling reaction to make at least a bottom surface of the second opening become lyophobic.

Optionally, in some embodiments of this disclosure, the hydrophobic material is octadecyl trichlorosilane.

Beneficial Effect

An embodiment of this disclosure provides a display panel and a method of manufacturing the same. The display panel provided by an embodiment of this disclosure includes an array substrate, a first electrode layer, a pixel definition layer, a light-emitting functional layer and a second electrode layer. A first opening and a second opening are disposed on the pixel definition layer. A side surface of a pixel electrode layer away from the array substrate is lower than a side surface of an auxiliary electrode layer away from the array substrate, so that topography of the second opening is higher than that of the first opening of the light-emitting region of the pixel, and it is difficult for the light-emitting functional layer to be deposited into the second opening. Thus, the phenomenon that the material of the light-emitting functional layer is deposited into the second opening can be improved to decrease the resistance of the bridging portion between the second electrode layer and the auxiliary electrode layer.

BRIEF DESCRIPTION OF THE SEVERAL VIEWS OF THE DRAWINGS

In order to explain the technical solution in the present application more clearly, the drawings required for the description of the embodiments will be briefly introduced. Obviously, the drawings in the following description only relate to some embodiments of the present application. Other drawings can be obtained from these drawings without creative works for those skilled in the art.

DESCRIPTION OF SPECIFIC EMBODIMENTS OF THE INVENTION

The technical solutions in the embodiments of this disclosure will be clearly and completely described in the following with reference to the drawings of the embodiments of this disclosure. Obviously, the described embodiments are only a part of the embodiments of this disclosure, rather than all the embodiments. Based on the embodiments of this disclosure, all other embodiments obtained by those skilled in the art without creative works are deemed as falling within the scope of this disclosure. In addition, it should be understood that the specific implementations described herein are only used to illustrate and explain this disclosure, and are not used to limit this disclosure. In this disclosure, unless explanation is made to the contrary, the orientation words, used such as "upper" and "lower," generally refer to the upper and lower positions of the device in an actual use or working state, and specifically refer to the drawing directions in the drawings; and "inner" and "outer" refer to the outline of the device.

Embodiments of this disclosure provide a display panel and a method of manufacturing the same. Detailed descriptions will be respectively made in the following. It should be noted that the order of descriptions in the following embodiments is not intended to limit the preferred order of the embodiments.

Figure 1:
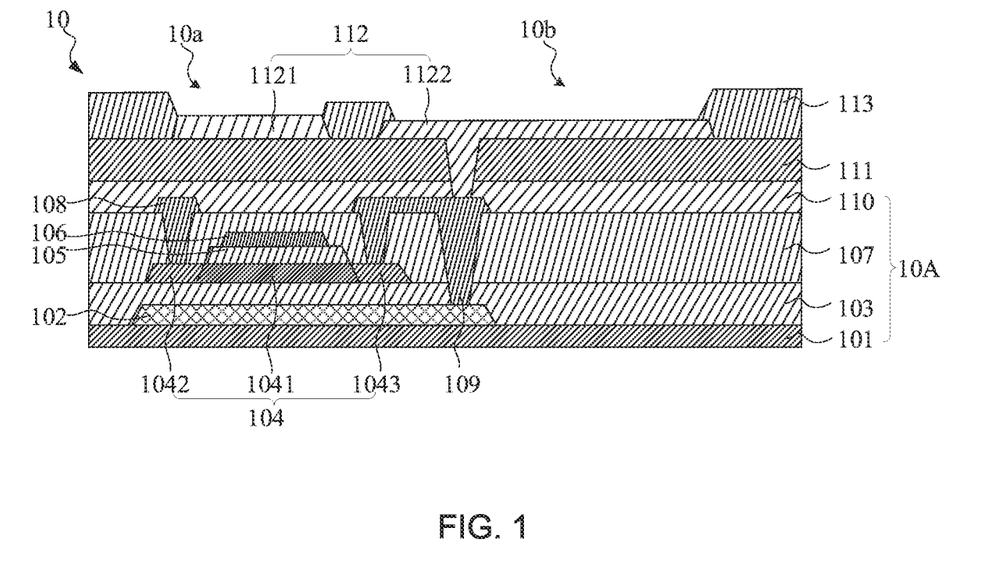
FIG. 1 is a first schematic structure view showing a display panel provided by an embodiment of this disclosure.
Figure 2:
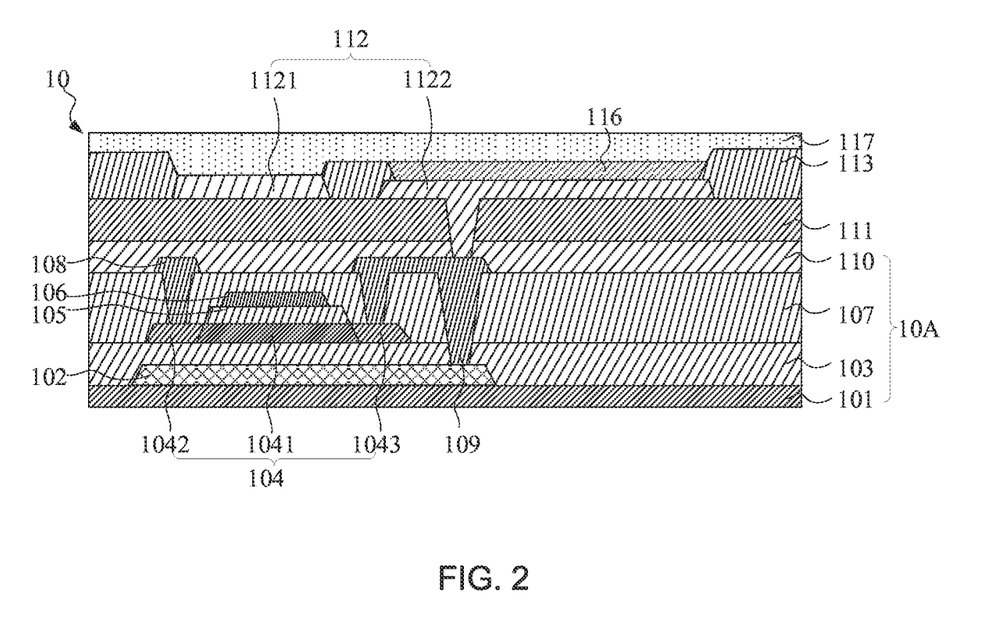
FIG. 2 is a second schematic structure view showing a display panel provided by an embodiment of this disclosure.

FIG. 1 is a first schematic structure view showing a display panel provided by an embodiment of this disclosure. FIG. 2 is a second schematic structure view showing a display panel provided by an embodiment of this disclosure. Referring to FIGS. 1 and 2, a display panel 10 provided by an embodiment of this disclosure includes an array substrate a first electrode layer 112, a pixel definition layer 113, a light-emitting functional layer 116 and a second electrode layer 117. The first electrode layer 112 is disposed on the array substrate 10A. The first electrode layer 112 includes a pixel electrode layer 1122 and an auxiliary electrode layer 1121. The pixel definition layer 113 is disposed on one side of the first electrode layer 112 away from the array substrate 10A. A first opening 10a and a second opening 10b are disposed on the pixel definition layer 113. The first opening 10a is disposed in correspondence with the pixel electrode layer 1122. The second opening 10b is disposed in correspondence with the auxiliary electrode layer 1121, wherein a side surface of the pixel electrode layer 1122 away from the array substrate 10A is lower than a side surface of the auxiliary electrode layer 1121 away from the array substrate 10A. The light-emitting functional layer 116 is disposed on one side of the pixel electrode layer 1122 away from the array substrate 10A, and connected to the pixel electrode layer 1122 through the first opening 10a. The second electrode layer 117 is disposed on one side of the light-emitting functional layer 116 away from the array substrate 10A, and connected to the auxiliary electrode layer 1121 through the second opening 10b.

An embodiment of this disclosure provides a display panel 10. The display panel 10 provided by an embodiment of this disclosure includes an array substrate 10A, a first electrode layer 112, a pixel definition layer 113, a light-emitting functional layer and a second electrode layer. A first opening 10a and a second opening 10b are disposed on the pixel definition layer 113. A side surface of a pixel electrode layer 1122 away from the array substrate 10A is lower than a side surface of an auxiliary electrode layer 1121 away from the array substrate 10A. By reducing a depth d2 of the second opening 10b where the second electrode layer and the auxiliary electrode layer 1121 are bridged together, topography of the second opening 10b is higher than that of the first opening 10a of the light-emitting region of the pixel, and it is difficult for the light-emitting functional layer 116 to be deposited into the second opening 10b. Thus, the phenomenon that the material of the light-emitting functional layer 116 is deposited into the second opening 10b can be improved to decrease the resistance of the bridging portion between the second electrode layer 117 and the auxiliary electrode layer 1121.

Optionally, a thickness of the auxiliary electrode layer 1121 is greater than a thickness of the pixel electrode layer 1122. The auxiliary electrode layer 1121 and the pixel electrode layer 1122 are manufactured on the same layer. In the embodiment of this disclosure, a halftone mask process may be adopted to form the structure, in which that the thickness of the auxiliary electrode layer 1121 is greater than the thickness of the pixel electrode layer 1122. Alternatively, it is possible to adopt multiple etching processes or add a lithography process, so that the thickness of the pixel electrode layer 1122 is smaller than the thickness of the auxiliary electrode layer 1121.

Optionally, at least a bottom surface of the second opening 10b is lyophobic. Specifically, in some embodiments, the bottom surface the second opening 10b is lyophobic. In other embodiments, both the bottom surface of the second opening 10b and a sidewall of the second opening 10b are lyophobic.

Performing the lyophobic treatment on a surface of the second opening 10b can better prevent the material of the light-emitting functional layer 116 from entering the second opening 10b, and prevent the material of the light-emitting functional layer from affecting the bridge between the second electrode layer 117 and the auxiliary electrode layer 1121. A method of coating a hydrophobic material on the surface of the second opening 10b can be adopted, so that the bottom surface or the bottom surface and the sidewall of the second opening 10b become lyophobic. Optionally, the hydrophobic material may have the longer alkyl chain, and may be octadecyl trichlorosilane, for example.

Optionally, a hydrophilic material or a hydrophobic material may be added to the surface of the second opening 10b to undergo a self-assembling reaction, so that the surface of the second opening 10b becomes lyophobic. The hydrophilic material undergoing the self-assembling reaction may be the self-assembling material consisting of —OH, —F, —Cl, —Br, —I, —CHO and —COOH groups. The hydrophobic material undergoing the self-assembling reaction may be the material, such as octadecyl trichlorosilane, having the longer alkyl chain.

Optionally, one side of the pixel definition layer 113 near the array substrate 10A is lyophilic, and one side of the pixel definition layer 113 away from the array substrate 10A is lyophobic.

The lyophilic property means that the surface of the material is easily wetted or dissolved by the liquid medium. The lyophobic property (also referred to as liquid repellency) is contrary to the lyophilic property, and means that the surface of the material cannot be easily wetted or dissolved by the liquid medium. The lyophilic property and the liquid repellency of the surface of the material are mainly determined by the nature of its surface structure or functional groups. In this disclosure, the lyophilic and lyophobic properties of the pixel definition layer 113 can be changed or adjusted by adjusting process parameters, such as the parameters in the development process and curing process. Changing or adjusting the lyophilic and lyophobic properties of the pixel definition layer 113 can be adapted to different printing processes, ink types and thicknesses of film layers, so that the pixel definition layer 113 can be adapted to requirements of different display panels more easily.

Specifically, the thickness of the material of the pixel definition layer 113 affects the lyophilic and lyophobic properties of the material. For example, the lyophobic material is not lyophobic when it is very thin. In addition, performing oxygen (O2) or nitrogen (N2) plasma treatment on the material can make the lyophobic material become lyophilic, and performing the fluorine gas (F) plasma treatment on the material can make the lyophilic become lyophobic.

Optionally, the pixel definition layer 113 has a line-bank structure. That is, the opening of the pixel definition layer 113 in the panel is a through strip opening in at least one of vertical and horizontal directions, so that the pixel definition layer 113 also has a through strip shape. The pixel definition layer 113 having the line-bank structure is further beneficial to that the organic molecules of ink-jet printing film obtain the better uniformity. When the pixel definition layer 113 is configured to have the line-bank structure, the portions of the pixel definition layer 113 on the left and right sides of the pixel electrode layer 1122 have different heights. The line-bank structure is the technical means well known to those skilled in the art, and detailed descriptions thereof will be omitted.

The light-emitting functional layer 116 in the OLED display panel can be manufactured by using the ink-jet printing (IJP) process. The light-emitting functional layer 116 of the ink-jet printing has the lower material concentration, and a higher amount of material of the light-emitting functional layer 116 needs to be printed to the target film thickness of the light-emitting functional layer. However, the higher amount of material of the light-emitting functional layer 116 usually tends to overflow from the opening upon printing and cause the bridge connection with other colors of materials of the light-emitting functional layer 116 to cause color mixing. In the embodiment of this disclosure, one side of the pixel definition layer 113 near the array substrate 10A is lyophilic, and one side away from the array substrate 10A is lyophobic, so that it is possible to prevent the light-emitting functional layer 116 in the first opening 10a from overflowing to cause color mixing, and to prevent the light-emitting functional layer 116 from flowing into the second opening 10b to affect the bridge resistance between the auxiliary electrode layer 1121 and the second electrode layer 117.

Optionally, the array substrate 10A includes a substrate 101, a light-shielding layer 102 disposed on the substrate 101, a buffer layer 103 being disposed on the substrate 101 and covering the light-shielding layer 102, an active layer 104 sequentially laminated on the buffer layer 103 from bottom to top, a gate insulating layer 105 and a gate layer 106, and an interlayer dielectric layer 107 being disposed above the buffer layer 103 and covering the active layer 104, the gate insulating layer 105 and the gate layer 106. The active layer 104 includes a channel region 1041, and a source region 1042 and a drain region 1043 disposed on two sides of the channel region 1041, and a source 108 and a drain 109 disposed on the interlayer dielectric layer 107. The source 108 and the drain 109 are respectively electrically connected to the source region 1042 and the drain region 1043. A passivation layer 110 covers the source 108 and the drain 109. The pixel electrode layer 1122 is connected to the source 108 or the drain 109. The array substrate 10A may further include other structures. The structure and specific configuration of the array substrate 10A are common technical means in this field, and detailed descriptions thereof will be omitted.

It is to be described that this disclosure does not restrict the structure of the thin film transistor (TFT) formed in the array substrate 10A. The TFT may be a top-gate type TFT, a bottom-gate type TFT, a dual-gate type TFT, or a single-gate type TFT. The specific structure of the TFT will not be further described in this disclosure.

Figure 3:
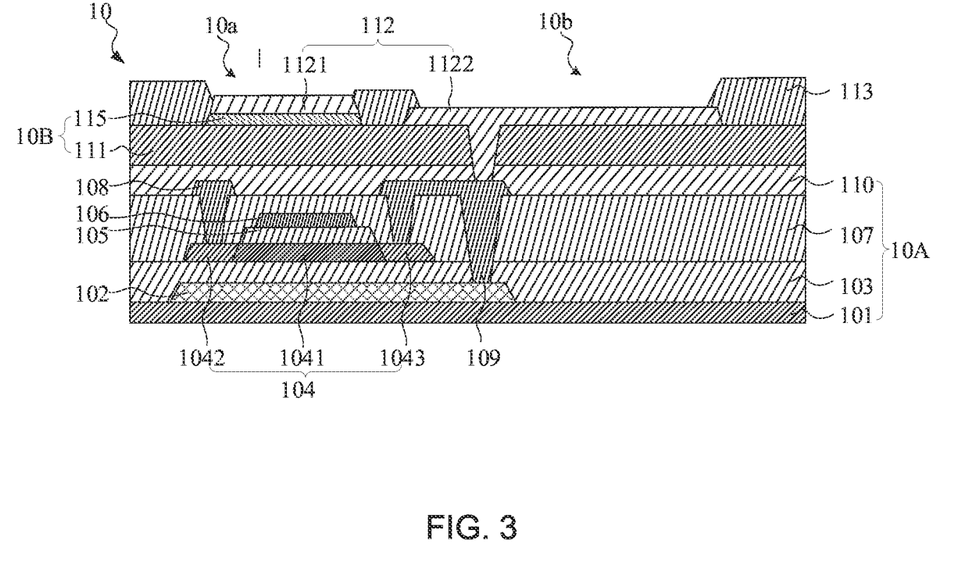
FIG. 3 is a third schematic structure view showing a display panel provided by an embodiment of this disclosure.

FIG. 3 is a third schematic structure view showing a display panel provided by an embodiment of this disclosure. Optionally, referring to FIG. 3, a display panel 10 provided by an embodiment of this disclosure further includes an elevation layer 114 disposed on the array substrate 10A. The auxiliary electrode layer 1121 is disposed in correspondence with the elevation layer 114 and disposed on one side of the elevation layer 114 away from the array substrate 10A.

The elevation layer 114 may be a single-layer structure or a laminated structure formed by a material selected from a group consisting of a silicon oxygen compound, a silicon nitrogen compound and a silicon oxygen nitrogen compound. The elevation layer 114 may also be a single-layer structure or a laminated structure formed by a combination of one or multiple ones of polyimide, polyethylene naphthalate, polyethylene terephthalate, polyarylate, polycarbonate, polyetherimide and polyethersulfone.

It is to be described that because the elevation layer 114 is disposed below the auxiliary electrode layer 1121, the auxiliary electrode layer 1121 and the pixel electrode layer 1122 can be manufactured without adopting the halftone mask method. Therefore, the thickness of the auxiliary electrode layer 1121 and the thickness of the pixel electrode layer 1122 may be the same.

Figure 4:
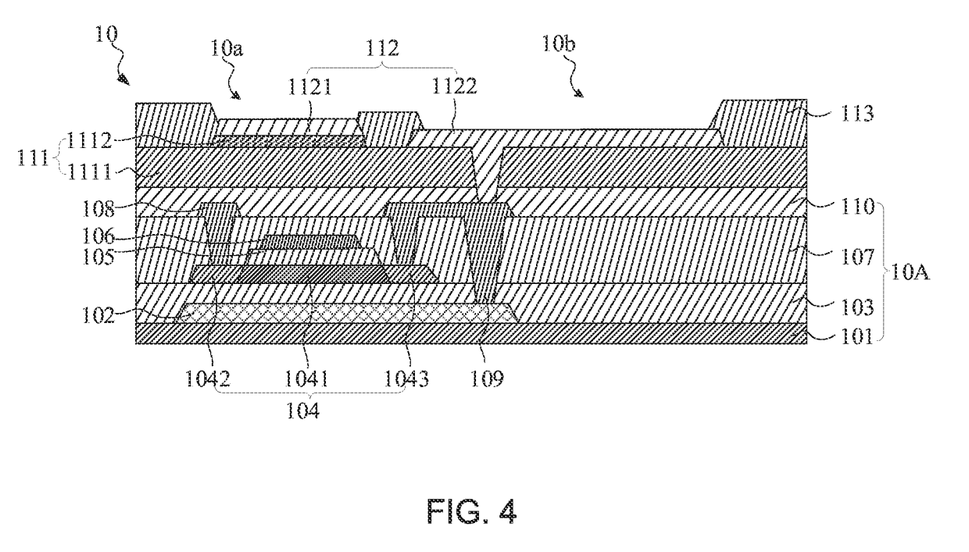
FIG. 4 is a fourth schematic structure view showing a display panel provided by an embodiment of this disclosure.

FIG. 4 is a fourth schematic structure view showing a display panel provided by an embodiment of this disclosure. Optionally, referring to FIG. 4, a display panel 10 further includes a planarization layer 111, which includes a first planarization layer 1111 and a second planarization layer 1112. The first planarization layer 1111 is disposed on the array substrate 10A. The second planarization layer 1112 is disposed on one side of the first planarization layer 1111 away from the array substrate 10A. The second planarization layer 1112 partially covers the first planarization layer 1111. The auxiliary electrode layer 1121 is disposed in correspondence with the second planarization layer 1112. The elevation layer is the second planarization layer 1112.

Figure 5:
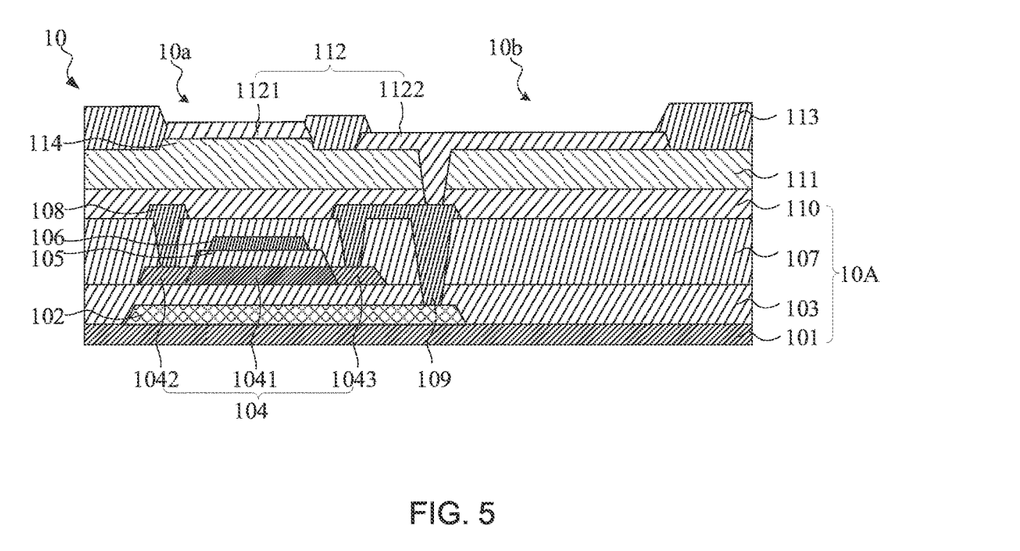
FIG. 5 is a fifth schematic structure view showing a display panel provided by an embodiment of this disclosure.

FIG. 5 is a fifth schematic structure view showing a display panel provided by an embodiment of this disclosure. Optionally, referring to FIG. 5, the display panel 10 further includes a planarization layer 111. The planarization layer 111 is disposed on the array substrate 10A. A protrusion 115 is disposed on the planarization layer 111. The elevation layer is the protrusion 115.

By providing the elevation layer 114, a side surface of the pixel electrode layer 1122 away from the array substrate 10A is lower than a side surface of the auxiliary electrode layer 1121 away from the array substrate 10A. According to the method of adopting the elevation layer 114 to adjust the heights of the two electrode layers, only one film layer needs to be added, and the configuration method is simple and convenient.

Figure 6:
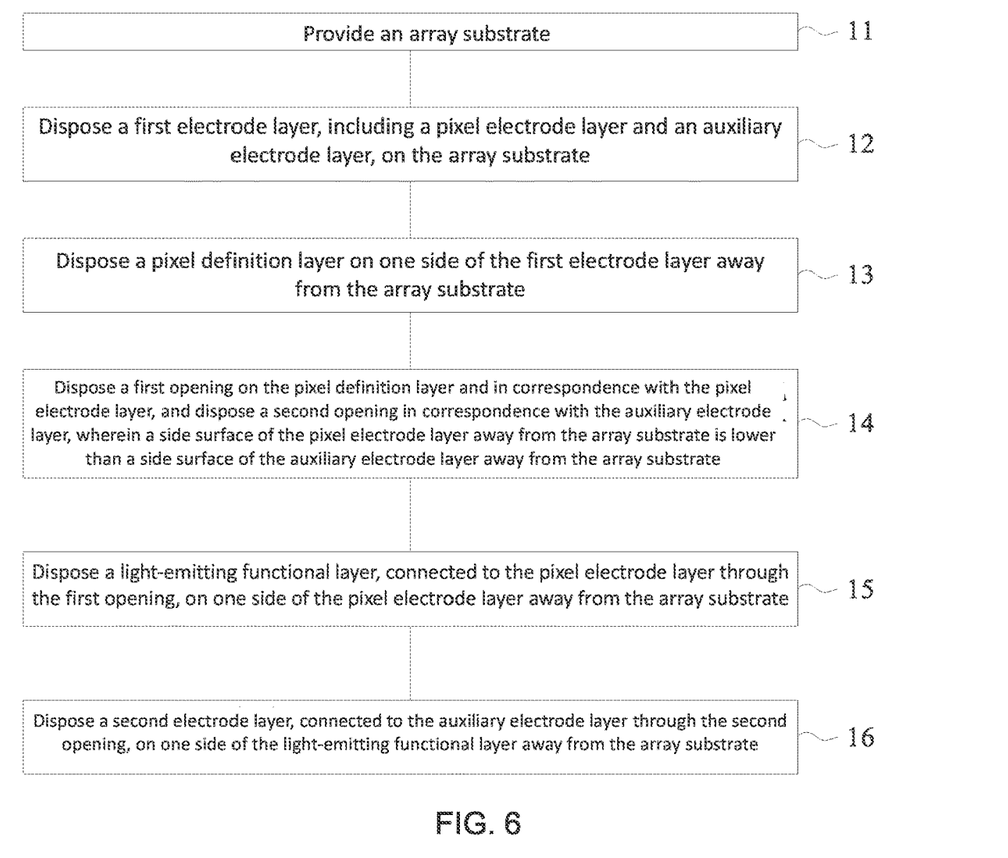
FIG. 6 is a schematic flow chart showing a method of manufacturing a display panel provided by an embodiment of this disclosure.

An embodiment of this disclosure further provides a method of manufacturing a display panel. FIG. 6 is a schematic flow chart showing a method of manufacturing a display panel provided by an embodiment of this disclosure. Referring to FIG. 6, the method of manufacturing the display panel provided by the embodiment of this disclosure specifically includes the following steps S11 to S16.

In the step 11, an array substrate is provided.

The array substrate includes a substrate, a light-shielding layer, a buffer layer, an active layer, a gate insulating layer, a gate layer, an interlayer insulating layer, a source-drain metal layer and a passivation layer sequentially laminated and arranged. Specifically, the above-mentioned film layers are sequentially formed the substrate by using processes, such as chemical vapor deposition, physical vapor deposition, lithography, etching and the like.

In one embodiment, a composite layer (MoTi/Cu), including a molybdenum titanium compound and copper sequentially deposited, is formed on the substrate, and then the metal layer is patterned sequentially through processes, such as exposure, development, etching and the like, to form a light-shielding layer (LS) of a TFT. A composite layer (SiNx/SiOx), including a silicon nitrogen compound and a silicon oxygen compound sequentially deposited, is formed on the LS layer to function as a buffer layer. A transparent metal oxide layer is deposited on the buffer layer, and then the metal layer is patterned through processes, such as exposure, development, etching and the like, to form a gate layer of the TFT. The SiOx layer functioning as an insulating layer (gate insulating layer) of the gate electrode (insulator gate) is disposed on the gate layer. The gate layer not covered by the gate insulating layer is formed into a channel layer, which is also referred to as an active layer. A silicon oxygen compound (SiOx) layer is deposited on the channel layer, and then patterned through processes, such as exposure, development, etching, stripping and the like, to form an interlayer insulating layer of the TFT to protect the gate layer. The MoTi/Cu metal layer is deposited on the interlayer insulating layer, and then the metal layer is patterned through processes, such as exposure, development, etching, stripping and the like, to form a drain and a source of the TFT. A resin layer is coated on the drain and source electrode layers, and then the resin layer is patterned through processes, such as exposure, development and the like, to form a passivation (resin) layer to passivate and protect each of the existing layers.

The specific film layers and assemblies thereof in the array substrate pertain to the technical means well known to those skilled in the art, and detailed descriptions thereof will be omitted herein.

In the step 12, a first electrode layer including a pixel electrode layer and an auxiliary electrode layer is disposed on the array substrate.

In one embodiment, the depositing process is adopted to form a first electrode material layer on the array substrate, and transparent metal oxide or a laminated layer of metal and transparent metal oxide may be adopted as the first electrode material.

The material of the transparent metal oxide layer includes any one of indium gallium zinc oxide, indium zinc tin oxide, indium gallium zinc tin oxide, indium tin oxide (ITO), indium zinc oxide, indium aluminum zinc oxide, indium gallium tin oxide and antimony tin oxide. The above-mentioned materials have very good electroconductivity and transparency and the smaller thickness, and cannot affect the whole thickness of the display panel. Meanwhile, the electronic radiation and ultraviolet and infrared light that are harmful to the human body can also be reduced.

The material of the metal layer is any one of silver, aluminum, nickel (Ni), chromium (Cr), molybdenum (Mo), copper, tungsten (W) and titanium (Ti). The metal has good electroconductivity and lower cost, and can reduce the manufacturing cost while guaranteeing the electroconductivity of the anode.

In one embodiment, the first electrode layer deposited is an ITO/Ag/ITO laminated layer.

Specifically, under the action of plasma or electric field, bombardment is performed on the first electrode material to sputter out molecules, atoms, ions and electrons of the first electrode material, wherein the first electrode material being sputtered out possesses certain kinetic energy and is sputtered toward the array substrate in a certain direction to thereby form the first electrode material on the array substrate. Since the depositing method is adopted, the speed is high, the film layer is dense, the adhesion is good, and it is very suitable for the high-volume, high-efficiency industrial production.

After the first electrode material has been deposited, patterning is performed on the first electrode material to obtain the pixel electrode layer and the auxiliary electrode layer.

In one embodiment, halftone mask processing is performed on the first electrode material, so that a thickness of the auxiliary electrode layer is greater than a thickness of the pixel electrode layer, and that a side surface of the pixel electrode layer away from the array substrate is lower than a side surface of the auxiliary electrode layer away from the array substrate.

The half-tone mask process performs the incomplete exposure on the photoresist according to the partial light transmission property of the grating, wherein the light transmission rate of the translucent portion is determined according to the height difference required by film layer etching. The half-tone mask process is to combine the two exposure processes into one. One exposure process can be saved, the production cycle can be shortened, the production efficiency can be improved, and the manufacturing cost can be decreased.

In a step 13, a pixel definition layer is disposed on one side of the first electrode layer away from the array substrate.

A pixel definition layer material, which may be an organic photoresist, is coated on the first electrode layer. In this disclosure, a positive photoresist or a negative photoresist material may be adopted, and no restriction is made.

Specifically, a coating method is adopted to form the pixel definition layer material on one side of the first electrode layer away from the array substrate and into the gap. Specifically, the pixel definition layer material is firstly coated onto one side of the first electrode layer away from the array substrate and into the gap, and then the pixel definition layer material is planarized and thermally cured. The coating method has the controllable processes. After coating, it is beneficial to the structure stabilization of the pixel definition layer, the prevention of the damage to the structure of the pixel definition layer in the subsequent process, the decrease of the manufacturing cost, and the enhancement of the production efficiency.

In a step 14, a first opening is disposed on the pixel definition layer and in correspondence with the pixel electrode layer, a second opening is disposed in correspondence with the auxiliary electrode layer; and a side surface of the pixel electrode layer away from the array substrate is lower than side surface of the auxiliary electrode layer away from the array substrate.

Optionally, the step of disposing the first opening on the pixel definition layer and in correspondence with the pixel electrode layer, and disposing the second opening in correspondence with the auxiliary electrode layer includes a step of: performing halftone mask processing on the pixel definition layer to dispose the first opening on the pixel definition layer and in correspondence with the pixel electrode layer, and dispose the second opening in correspondence with the auxiliary electrode layer.

Because the halftone mask process can perform the full exposure and partial exposure processing onto different regions of the photoresist concurrently, a mask process can be performed to obtain the first opening and the second opening having different depths, so that the side surface of the pixel electrode layer away from the array substrate is lower than the side surface of the auxiliary electrode layer away from the array substrate. Thus, one exposure process can be saved, the production cycle can be shortened, the production efficiency can be improved, and the manufacturing cost can be decreased.

Optionally, after the step of disposing the first opening on the pixel definition layer and in correspondence with the pixel electrode layer, and disposing the second opening in correspondence with the auxiliary electrode layer, the method further includes the step of evaporating a hydrophobic material in the second opening to form a hydrophobic layer on the bottom surface of the second opening.

Optionally, by adjusting the evaporation angle after the hydrophobic layer is formed on the bottom surface of the second opening, the hydrophobic layer may also be formed on the sidewall of the second opening.

Optionally, after the step of disposing the first opening on the pixel definition layer and in correspondence with the pixel electrode layer, and disposing the second opening in correspondence with the auxiliary electrode layer, the method further includes a step of: adding a hydrophobic material to the bottom surface of the second opening, wherein the hydrophobic material undergoes a self-assembling reaction to form the hydrophobic layer on the bottom surface of the second opening.

The hydrophilic material undergoing the self-assembling reaction may be a self-assembling material containing a material selected from a group consisting of —OH, —F, —Cl, —Br, —I, —CHO and —COOH groups. The hydrophobic material undergoing the self-assembling reaction may be a material, such as octadecyl trichlorosilane, having the longer alkyl chain.

In the step 15, a light-emitting functional layer is disposed on one side of the pixel electrode layer away from the array substrate and is connected to the pixel electrode layer through the first opening.

The light-emitting functional layer may include a hole injection layer, a hole transport layer, a light-emitting layer, an electron transport layer and an electron injection layer which are laminated and arranged in a direction away from a first surface direction.

Specifically, the ink-jet printing method is adopted to form the hole injection layer, the hole transport layer, the light-emitting layer, the electron transport layer and the electron injection layer sequentially on a first surface. Specifically, an organic material is ink-jet printed on the first surface, planarized and dried, and then baked to obtain the light-emitting functional layer. The ink-jet printing method can precisely control the film formation region, save the material, decrease the cost and increase the product yield.

In a step 16, a second electrode layer, connected to the auxiliary electrode layer through the second opening, is disposed on one side of the light-emitting functional layer away from the array substrate.

A metal material is adopted to form the second electrode layer. Specifically, the metal material may be one of magnesium (Mg) or silver (Ag) or a combination thereof. The second electrode layer has the good permeability in the visible light region.

The method of manufacturing the display panel provided by the embodiment of this disclosure is used to manufacture a display panel. The display panel provided by the embodiment of this disclosure includes the array substrate, the first electrode layer, the pixel definition layer, the light-emitting functional layer and the second electrode layer. The first opening and the second opening are disposed on the pixel definition layer. The side surface of the pixel electrode layer away from the array substrate is lower than the side surface of the auxiliary electrode layer away from the array substrate. By decreasing the depth of the second opening, in which the second electrode layer and the auxiliary electrode layer are bridged together, topography of the second opening is higher than that of the first opening of the light-emitting region of the pixel, and it is difficult for the light-emitting functional layer to be deposited into the second opening. Thus, the phenomenon that the material of the light-emitting functional layer is deposited into the second opening can be improved to decrease the resistance of the bridging portion between the second electrode layer and the auxiliary electrode layer.

A detailed introduction to the display panel and the method of manufacturing the same provided by the embodiment of this disclosure has been made hereinabove. In this disclosure, specific examples are used to explain the principles and implementation of this disclosure. The descriptions of the above-mentioned embodiments are only used to help the understanding of the method and core idea of this disclosure. Meanwhile, those skilled in the art will make changes to the specific implementation and the application range according to the idea of this disclosure. In summary, the contents of the specification should not be construed as a limitation to this disclosure.

What is claimed is:

1. A display panel, comprising:
   an array substrate;
   a first electrode layer disposed on the array substrate and comprising a pixel electrode layer and an auxiliary electrode layer;
   a pixel definition layer disposed on one side of the first electrode layer away from the array substrate, wherein a first opening and a second opening are disposed on the pixel definition layer, the first opening is disposed in correspondence with the pixel electrode layer, the second opening is disposed in correspondence with the auxiliary electrode layer, and a side surface of the pixel electrode layer away from the array substrate is lower than a side surface of the auxiliary electrode layer away from the array substrate;
   a light-emitting functional layer disposed on one side of the pixel electrode layer away from the array substrate, and connected to the pixel electrode layer through the first opening; and
   a second electrode layer disposed on one side of the light-emitting functional layer away from the array substrate, and connected to the auxiliary electrode layer through the second opening;
   wherein the display panel further comprises an elevation layer disposed on the array substrate, and the auxiliary electrode layer is disposed in correspondence with the elevation layer and disposed on one side of the elevation layer away from the array substrate; and
   the display panel further comprises a planarization layer comprising a first planarization layer and a second planarization layer, the first planarization layer is disposed on the array substrate, the second planarization layer is disposed on one side of the first planarization layer away from the array substrate, the second planarization layer partially covers the first planarization layer, the auxiliary electrode layer is disposed in correspondence with the second planarization layer, and the elevation layer is the second planarization layer.

2. A display panel, comprising:
an array substrate;
a first electrode layer disposed on the array substrate and comprising a pixel electrode layer and an auxiliary electrode layer;
a pixel definition layer disposed on one side of the first electrode layer away from the array substrate, wherein a first opening and a second opening are disposed on the pixel definition layer, the first opening is disposed in correspondence with the pixel electrode layer, the second opening is disposed in correspondence with the auxiliary electrode layer, and a side surface of the pixel electrode layer away from the array substrate is lower than a side surface of the auxiliary electrode layer away from the array substrate;
a light-emitting functional layer disposed on one side of the pixel electrode layer away from the array substrate, and connected to the pixel electrode layer through the first opening; and
a second electrode layer disposed on one side of the light-emitting functional layer away from the array substrate, and connected to the auxiliary electrode layer through the second opening;
wherein the display panel further comprises an elevation layer disposed on the array substrate, and the auxiliary electrode layer is disposed in correspondence with the elevation layer and disposed on one side of the elevation layer away from the array substrate; and
the display panel further comprises a planarization layer disposed on the array substrate, a protrusion is disposed on the planarization layer, and the elevation layer is the protrusion.

3. The display panel according to claim 1, wherein a thickness of the auxiliary electrode layer is the same as a thickness of the pixel electrode layer.

4. The display panel according to claim 1, wherein the elevation layer has a single-layer structure or a laminated structure including a combination of one or more of polyimide, polyethylene naphthalate, polyethylene terephthalate, polyarylate, polycarbonate, polyetherimide or polyethersulfone.

5. The display panel according to claim 1, wherein the elevation layer is a single-layer structure or a laminated structure having a material selected from a group consisting of a silicon oxygen compound, a silicon nitrogen compound and a silicon oxygen nitrogen compound.

6. The display panel according to claim 1, wherein a thickness of the auxiliary electrode layer is greater than a thickness of the pixel electrode layer.

7. The display panel according to claim 1, wherein at least a bottom surface of the second opening is lyophobic.

8. The display panel according to claim 7, wherein the bottom surface of the second opening and a sidewall of the second opening are both lyophobic.

9. The display panel according to claim 1, wherein the pixel definition layer on two sides of the pixel electrode layer has different heights.

10. The display panel according to claim 1, wherein one side of the pixel definition layer near the array substrate is lyophilic, and one side of the pixel definition layer away from the array substrate is lyophobic.

11. The display panel according to claim 1, wherein the array substrate comprises a substrate, a light-shielding layer disposed on the substrate, a buffer layer disposed on the substrate and covering the light-shielding layer, an active layer, a gate insulating layer and a gate layer sequentially laminated on the buffer layer from bottom to top, an interlayer dielectric layer disposed above the buffer layer and covering the active layer, the gate insulating layer and the gate layer, and a source and a drain disposed on the interlayer dielectric layer.

12. The display panel according to claim 11, wherein the active layer comprises a channel region, and a source region and a drain region disposed on two sides of the channel region, and the source and the drain are respectively electrically connected to the source region and the drain region.

13. The display panel according to claim 12, wherein the array substrate further comprises a passivation layer covering the source and the drain, and the pixel electrode layer passes through the passivation layer and is connected to the source or the drain.

14. A method of manufacturing a display panel, the method comprising following steps of:
providing an array substrate;
disposing a first electrode layer on the array substrate, wherein the first electrode layer comprises a pixel electrode layer and an auxiliary electrode layer;
disposing a pixel definition layer on one side of the first electrode layer away from the array substrate;
disposing a first opening on the pixel definition layer and in correspondence with the pixel electrode layer, and disposing a second opening in correspondence with the auxiliary electrode layer, wherein a side surface of the pixel electrode layer away from the array substrate is lower than a side surface of the auxiliary electrode layer away from the array substrate;
disposing a light-emitting functional layer on one side of the pixel electrode layer away from the array substrate, wherein the light-emitting functional layer is connected to the pixel electrode layer through the first opening; and
disposing a second electrode layer on one side of the light-emitting functional layer away from the array substrate, wherein the second electrode layer is connected to the auxiliary electrode layer through the second opening;
wherein the method further comprises, after the step of disposing the first opening on the pixel definition layer and in correspondence with the pixel electrode layer, and disposing the second opening in correspondence with the auxiliary electrode layer, a step of:
evaporating a hydrophobic material in the second opening to make at least a bottom surface of the second opening become lyophobic.

15. The method according to claim 14, wherein the step of disposing the first opening on the pixel definition layer and in correspondence with the pixel electrode layer and disposing the second opening in correspondence with the auxiliary electrode layer comprises:
performing halftone mask processing on the pixel definition layer to dispose the first opening on the pixel definition layer and in correspondence with the pixel electrode layer, and dispose the second opening in correspondence with the auxiliary electrode layer.

16. The method according to claim 14, wherein the step of disposing the first opening on the pixel definition layer and in correspondence with the pixel electrode layer, and disposing the second opening in correspondence with the auxiliary electrode layer comprises:
adding a hydrophobic material to a bottom surface of the second opening, wherein the hydrophobic material undergoes a self-assembling reaction to make at least the bottom surface of the second opening become lyophobic.

17. The method according to claim 14, wherein the hydrophobic material is octadecyl trichlorosilane.

\* \* \* \* \*